(12) United States Patent
Karim

(10) Patent No.: US 7,196,403 B2
(45) Date of Patent: Mar. 27, 2007

(54) SEMICONDUCTOR PACKAGE WITH HEAT SPREADER

(75) Inventor: Abdul Hamid Karim, Singapore (SG)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/963,280

(22) Filed: Oct. 12, 2004

(65) Prior Publication Data
US 2005/0116335 A1    Jun. 2, 2005

(30) Foreign Application Priority Data
Oct. 13, 2003   (EP) ................... 03023225

(51) Int. Cl.
*H01L 23/495* (2006.01)
(52) U.S. Cl. ............... 257/675; 257/276; 257/625; 257/706; 257/707; 257/E23.069; 257/E23.092
(58) Field of Classification Search ............. 257/276, 257/625, 675, 706, 707, E23.069, E23.092
See application file for complete search history.

(56) References Cited

U.S. PATENT DOCUMENTS

| | | | |
|---|---|---|---|
| 5,156,923 | A | 10/1992 | Jha et al. |
| 5,349,237 | A | 9/1994 | Sayka et al. |
| 5,358,795 | A | 10/1994 | Nakamura et al. |
| 5,681,663 | A | 10/1997 | Schaller et al. |
| 5,736,785 | A | 4/1998 | Chiang et al. |
| 6,339,254 | B1 | 1/2002 | Venkateshwaran et al. |
| 6,429,513 | B1 | 8/2002 | Shermer, IV et al. |
| 6,444,498 | B1 | 9/2002 | Huang et al. |
| 6,570,764 | B2 * | 5/2003 | Bhatia et al. ............. 361/705 |
| 2003/0006501 | A1 | 1/2003 | Waki et al. |
| 2003/0020151 | A1 | 1/2003 | Chen et al. |
| 2003/0116836 | A1 | 6/2003 | Huang et al. |
| 2005/0093135 | A1 * | 5/2005 | Liu et al. ................. 257/707 |

FOREIGN PATENT DOCUMENTS

| | | |
|---|---|---|
| JP | 09260555 | 10/1997 |
| JP | 11297901 | 10/1999 |
| JP | 11297901 A | * 10/1999 |

OTHER PUBLICATIONS

A copy of Austrian Search Report mailed Sep. 5, 2005 (7 pgs.).

* cited by examiner

*Primary Examiner*—Andy Huynh
(74) *Attorney, Agent, or Firm*—Dicke, Billig & Czaja, PLLC

(57) ABSTRACT

A semiconductor package with heat spreader is disclosed. In one embodiment, the semiconductor package comprises a device carrier having a plurality of contact areas and a semiconductor die having a plurality of die pads of an active surface, the semiconductor die being mounted on the device carrier. Connection means to electrically connect the die pads to the contact areas and a heat spreading means mounted on the active surface of the die are provided. The heat spreading means includes an upper plate and a foot ring which protrudes from a bottom surface of the upper plate and which is positioned between the die pads on the active surface such that a cavity is formed between the heat spreading means and the active surface. The cavity is filled with an adhering means interconnecting the heat spreading means and the active surface.

27 Claims, 2 Drawing Sheets

SEMICONDUCTOR PACKAGE WITH HEAT SPREADER

CROSS-REFERENCE TO RELATED APPLICATIONS

This Utility Patent Application claims priority to European Patent Application No. EP 03023225.0, filed on Oct. 13, 2003, which is incorporated herein by reference.

FIELD OF THE INVENTION

The present invention relates to a structure of a semiconductor package.

BACKGROUND

Fuelled by exponential increases in device clock speeds, the heat which must be dissipated in electronic devices has grown dramatically in recent years. Poor heat dissipation in packaged electronic devices limits device performance and the size of the module. In some cases, the need for an external heat sink to manage the thermal dissipation has limited the size of a small module or end-product which is not in tune with the key technology trend. Electronics gadgets are growing smaller in size so that ever smaller modules containing an ever increasing density of devices are desired.

Heat dissipation is an increasing problem and improved thermal management is required. To date, this problem has not been satisfactorily solved to a extent particularly for simple low-cost heat dissipation.

One solution is the cavity-down approach. However, the routing space for signals, powers and grounds traces is limited which results in lower I/Os. Also, the assembly processes are difficult with high material and packaging costs.

U.S. Pat. No. 6,339,254B1 is said to disclose a stacked multi-chip assembly including a plurality of integrated circuit die directly attached to a substrate having pads corresponding to terminals on the die and interconnections between the die, and also external contacts.

U.S. Pat. No. 5,681,663 is said to disclose a heat spreader carrier strip including a first strip of laminated material portioned into smaller heat spreader portions with a welded second strip. Thermal manufacturing cycles are said not to cause a bowing of the second strip or of the heat spreader sections.

U.S. Pat. No. 5,156,923 is said to disclose a heat transferring circuit substrate including layers of copper and Invar which have limited thermal expansion.

U.S. Pat. No. 5,358,795 is said to disclose a heat-conductive material which receives and releases heat evenly, has high thermal conductivity, and can have any desired thermal expansion coefficient.

U.S. Pat. No. 5,736,785 is said to disclose a structure, shown in FIG. 5a, where a planar heat spreader is mounted on the top surface of a semiconductor die, which in turn is mounted on and electrically connected to a substrate. The planar heat spreader comprises a central recessed portion protruding from the bottom surface of the heat spreader surrounded by a plurality of apertures at the edges. The die is coated with a layer of adhesive covering also the bonding wires attaching the die to the substrate. This structure has a limited thermal efficiency.

SUMMARY

Embodiments of the invention comprise a semiconductor package with a heat spreader. In one embodiment the semiconductor package comprises a device carrier having a plurality of contact areas and a semiconductor die having a plurality of die pads of an active surface, the semiconductor die being mounted on the device carrier. Connection means to electrically connect the die pads to the contact areas and a heat spreading means mounted on the active surface of the die are provided. The heat spreading means includes an upper plate and a foot ring which protrudes from a bottom surface of the upper plate and which is positioned between the die pads on the active surface such that a cavity is formed between the heat spreading means and the active surface. The cavity is filled with an adhering means interconnecting the heat spreading means and the active surface.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
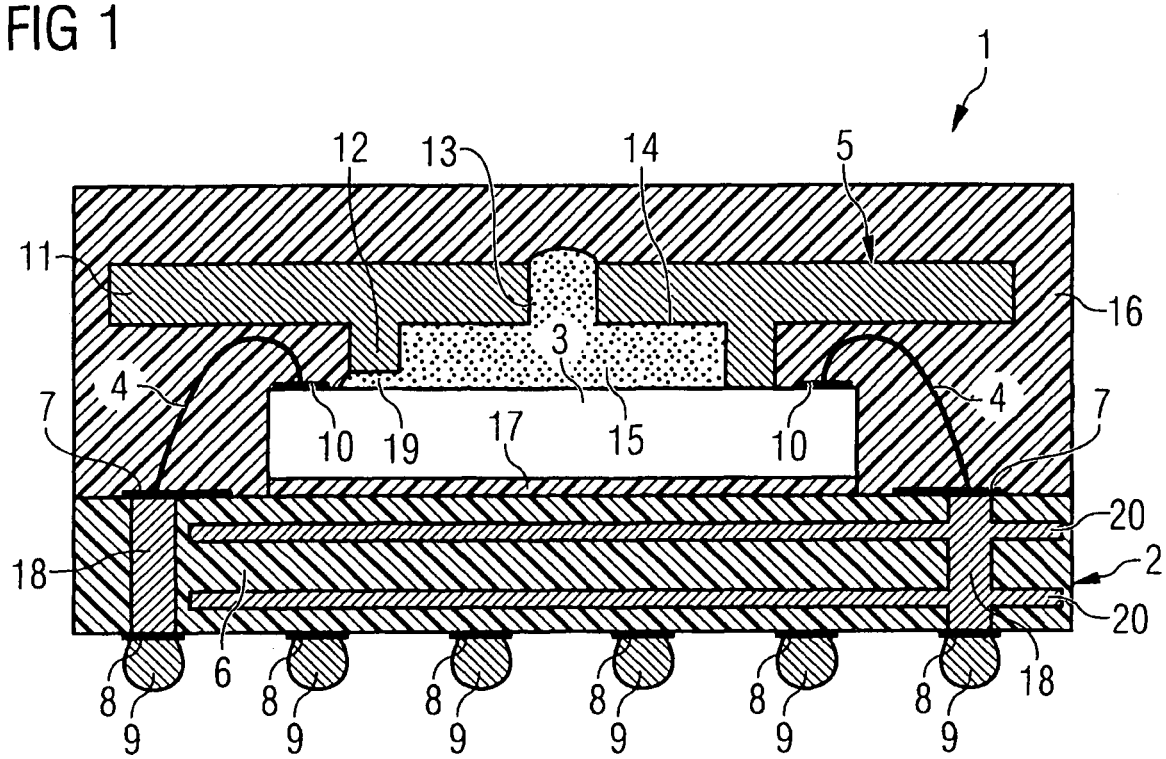
FIG. 1 illustrates a cross-sectional view of one embodiment of the structure of a semiconductor package according to the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a packaging structure offering an enhanced thermal management solution. In one embodiment, the invention provides an interface between the die and the heat spreader which is bridged in part by adhesive or solder. A fluid adhesive gives good physical connection between the die and heat spreader surfaces as a fluid compensates for surface imperfections. Even better thermal conductive properties are found in adhesives which are also at least partly electrically conductive as they contain metal particles. These cannot be used in the structure of U.S. Pat. No. 5,736,785, as the adhesive also covers the bonding wires and undesirable electrical shorts between the bonding wires and heat spreader will occur.

The present invention provides a semiconductor package comprising a device carrier having a plurality of contact areas, a semiconductor die having a plurality of die pads located at the edges of its active surface mounted to the device carrier, connection means to electrically connect the die pads on the die to the contact areas on the device carrier, a device contact means such as a solder ball array on the bottom side of the device carrier, and a heat spreading means which includes an upper plate and a foot ring which protrudes from a bottom surface of the upper plate and which is positioned between the die pads on the active surface such that a cavity is formed between the heat spreading means and the active surface, the cavity being filled with an adhering means interconnecting the heat spreading means and the active surface and methods of assembling such a package.

It is advantageous to attach a heat spreading means to the upper surface of the die as heat is dissipated upwards away from the board so that neighbouring devices are not overheated. There is also easy routing of the wires making up the electrical connections and there is no need for an external heat sink so that the size of the package is not increased. Conventional adhesives and packaging technology can be used simplifying the processing route.

A heat spreading means of high thermal conductivity preferably comprises a material selected from Cu, Al, Ag or an alloy of one of these, as these materials have good thermal conduction properties thus enabling efficient heat conduction away from the active surface. More preferably the heat spreading means comprises Cu as copper has good thermal conductivity, is readily available and is the least costly material. The heat spreading means is attached to the active surface of the die. The heat spreading means includes an upper plate and an integral foot ring protruding from the bottom surface.

The heat spreading means preferably includes an aperture located in the upper plate, the aperture extending between the cavity and the upper surface of the upper plate. This enables the cavity to be filled with adhesive material or other adhering means from above after the heat spreader has been placed onto the die.

The upper plate of the heat spreading means is preferably laterally square so as to be compatible with the existing assembly line and is preferably laterally larger than the width of the die in order to increase heat dissipation.

Preferably the foot ring is laterally square, so as to have the greatest contact area with the die, and has a height greater than the height of the connecting means above the upper surface of the die so that the upper plate section of the heat spreading means is not in contact with the connecting means and electrical shorting does not occur. The width of the foot ring is smaller than the distance between the die pads on opposing sides of the die again so that undesirable electrical contact is not made between the heat spreader and connecting means.

The at least partial direct contact between the heat spreading means and the active surface of the die facilitates the dissipation of heat through a small number of layers thereby enhancing heat dissipation.

Preferably the adhering means is a thermally conductive adhesive such as epoxy glue, sealant resin, thermal grease or liquid encapsulant in order to improve heat dissipation from the die to the heat spreading means. Preferably the adhesive material includes at least in part electrically conductive material as such adhesive has a high thermal conductivity.

The structure of a heat spreading means allows control of the adhesive means as the adhesive means is contained within the cavity and does not spread into surrounding area, in particular onto the connecting means. This enables the use of electrically conductive adhesive which has superior thermal conduction properties, thereby enabling improved heat dissipation.

The present invention also relates to methods of mounting a semiconductor package.

In one embodiment, the method comprises attaching a semiconductor die, which has a plurality of die pads on its active surface, to a device carrier such as BT or lead frame having contact areas by, for example, a die attach process. Electrical connections between the die and the substrate are made by, for example, attaching bond wires between the die pads and conductive traces on the substrate. Next, a heat spreading means, which includes an upper plate and foot ring which protrudes from a bottom surface of the upper plate, is positioned between the die pads on the active surface of the die such that a cavity is formed between the heat spreading means and the active surface. The cavity is then filled with adhering means such that the adhering means interconnects the heat spreading means and the active surface and curing the adhering means.

Preferably the cavity is filled with an adhering means by dispensing adhesive through an aperture located in the heat spreading means as this enables the adhesive to enter the cavity from above. The spread of the adhesive to be contained largely within the cavity.

A further method comprises the steps of attaching a semiconductor die, which has a plurality of die pads on its active surface and special contact areas for the solder adhering means, to a device carrier having a plurality of contact areas. Electrical connections are then made between the die and the substrate.

Next, a heat spreading means, which includes an upper plate and foot ring which protrudes from a bottom surface of the upper plate, is positioned between the die pads on the active surface such that a cavity is formed between the heat spreading means and the active surface. The cavity is then filled with solder means and the semiconductor package heated such that the solder means interconnects the heat spreading means and the active surface.

If a solder means is used for adhering the heat spreader to the active surface of the die, the semiconductor die may be provided with special contact areas for the solder on its active surface. Solder means has good thermal conductivity and the foot ring stops the solder from spreading onto the die pads and bond wires so that shorting between the device and heat spreader is prevented.

There are two methods for mounting the embodiment which includes solder adhering means. The solder means may be spread onto the surface of the die within the die pads before the heat spreader is positioned on the surface of the die. The solder and heat spreader are so positioned that the solder is contained within the foot ring of the heat spreading means. In this embodiment it is not necessary for the heat spreader to contain an aperture in the upper plate. The package is then heated so that the solder interconnects the foot ring and therefore the heat spreader with the active surface of the die.

Alternatively, the heat spreader is positioned on the die and the solder means dispensed through the aperture in the upper plate. The semiconductor package is then heated so that the solder means interconnects the heat spreading means and the active surface.

One further advantage of the present invention is that it offers a simple low-cost solution for enhanced thermal management whereby the current conventional assembly packaging technology of a laminate package can still be used. The invention can be used for all existing semiconductor devices. It eliminates the need for an external heat sink which doubles or triples the size (in terms of thickness) of the package or component. This affects the overall dimension of the modules or application boards. The present invention also enables improved trace routability over the existing cavity-down thermal management solutions.

The invention favors heat dissipation upwards from the active surface which means that heat is dissipated away from the board. This is highly desirable as heat dissipation paths along the device carrier could overheat the adjacent components when mounted onto the application board.

One embodiment of this invention includes an integrated circuit device whereby the heat spreader, which can be a composite of either Cu, Cu alloys, Al, Al alloys, Ag and Ag alloys is mounted onto this device using thermally conductive adhesives such as epoxy glue, sealant resins, thermal grease or even liquid encapsulant. Some of these adhesives can also be used to attach devices to a carrier such as a BT substrate or lead frame in the die attach process. Packaging of stack-die has also used such adhesives when attaching two devices together stacking them one on top of the other. One embodiment of the invention would be the use of selected material i.e. pure copper (Cu) for the heat spreader and an epoxy glue formulated with high adhesive and low viscosity properties as the thermally conductive adhesives to attach the heat spreader onto the die.

A concept introduced in the present invention can also be seen in the design of the aperture in the heat spreading means. This acts as a funnel so that the adhesive can be filled-in through this funnel to make the attachment of the heat spreader onto the die top. The funnel-like design allows the adhesives to be contained within the boundary of the heat spreader inner-walls which controls creeping of adhesive preventing it from smudging the surface of the dies. Under such well-defined process control, the contact area between the heat spreader base and the die top surface could also be enlarged to have optimum adhesion between the heat spreader and the die top and in addition creates also an avenue for another heat transfer path. This approach of having a direct attachment of heat spreader onto die top surface by means of dispensing adhesives improves its thermal properties.

The concept can be applied differently, e.g., by exposing the copper heat spreader or by burying the heat spreader by encapsulating it within the package. Both deliver the desired thermal dissipation except that the exposed heat spreader would have a better thermal dissipation performance. The design can be chosen to suit the kind of assembly process that has been established in the conventional platform of the process/production line.

The invention can be easily seen by X-Ray on the package or assembled component. Conventional packaging technology can be used without having to change or introduce an entirely new assembly process line.

FIG. 1 illustrates one exemplary embodiment of the invention. The semiconductor package 1 comprises a device carrier 2, a semiconductor die 3 which is electrically connected to the device carrier 2 by bond wires 4, and a heat spreader 5 which is mounted on the upper active surface of the die 3.

The device carrier 2 comprises an insulation carrier 6, multi-layer copper distribution traces 20, a plurality of contact areas 7 on its upper surface, a plurality of via contacts 18, and a plurality of device contacts 8 on its bottom surface. Solder balls 9 are attached to the device contacts 8. The inner structure of the device carrier 2 is illustrated by way of two via contacts 18 which connect a contact area 7 with a device contact 8.

The die 3 is mounted on the device carrier 2 and it has a plurality of die pads 10 located at the edges of its upper surface. Bond wires 4 between die pads 10 and the contact areas 7 electrically connect the die 3 to the device carrier 2.

A copper heat spreader 5 is mounted on the upper active surface of the die 3. The heat spreader 5 includes an upper plate 11 and a foot ring 12 which protrudes from the bottom surface of the upper plate 11. The foot ring 12 is integral with the upper plate 11. The upper plate 11 is laterally larger than the width of the die 3 and includes an aperture 13 located in the center of its lateral plane. The foot ring 12 is located centrally around the longitudinal axis of the upper plate 11. The height of the foot ring 12 is greater than the height of the bond wires 4 above the upper active surface of the die 3 and its width is smaller than the distance between the die pads 10 on opposing sides of the die 3.

The heat spreader 5 is positioned so that the foot ring 12 is mounted centrally on the upper surface of die 3 within the die pads 10. The bottom surface of the foot ring 12 is in partial contact with the upper surface of the die 3.

The cavity 14 formed by the aperture 13, by the foot ring 12 and by the upper surface of the die 3 is filled with adhesive material 15. The adhesive material 15 is highly adhesive, has a low viscosity, is thermally conductive and includes at least in part electrically conductive material.

Figure 2:
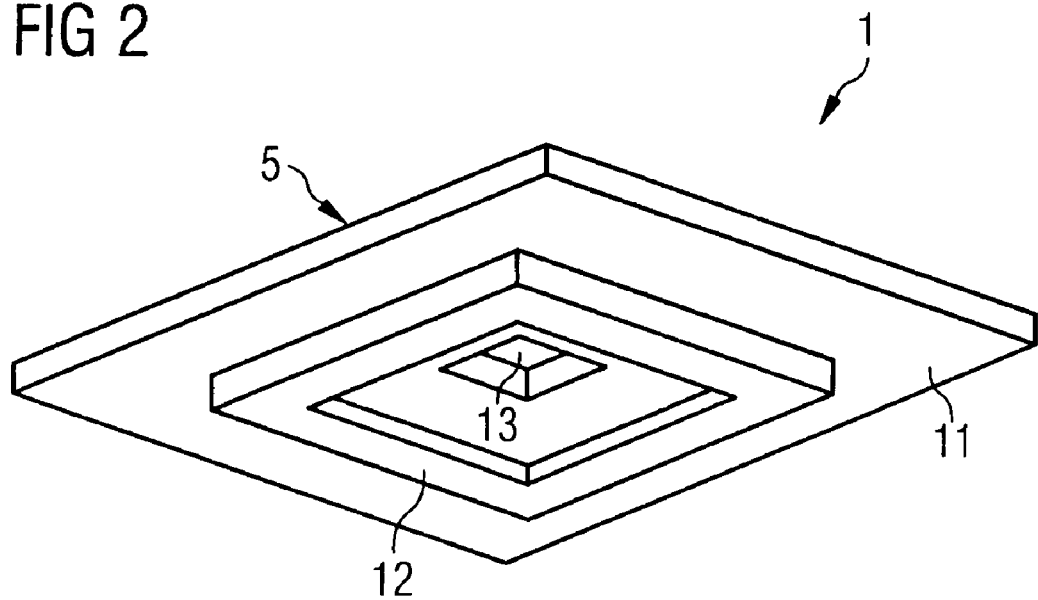
FIG. 2 illustrates a perspective and exploded view of the semiconductor package of FIG. 1.
Figure 2:
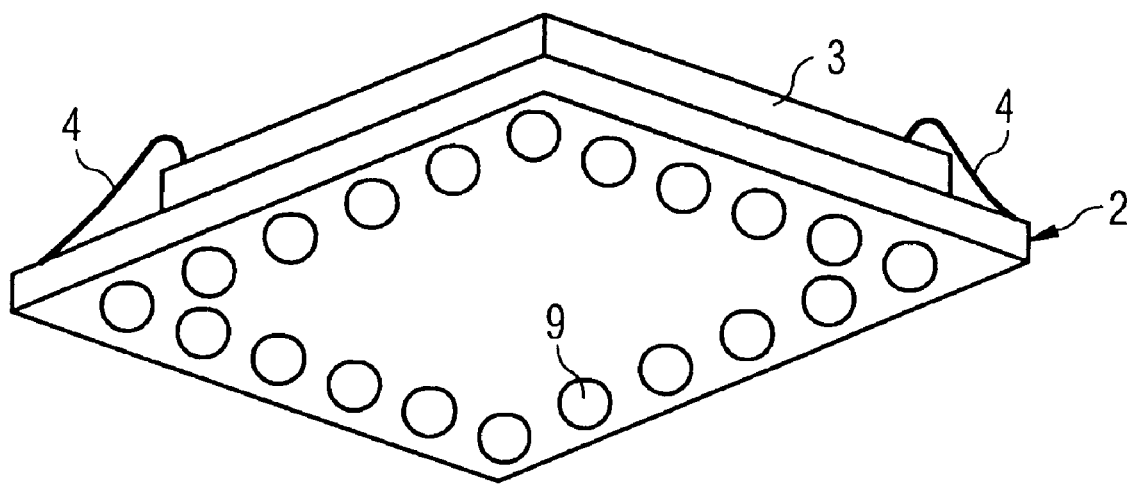

As can be seen in FIG. 1, but not FIG. 2, incomplete contact between the bottom surface of the foot ring 12 and upper surface of the die 3 results in discrete gaps 19 in the interface. These gaps are filled with the adhesive material 15.

The die 3, bond wires 4 and heat spreader 5 are encapsulated by a plastic cover 16.

As can be best seen in FIG. 2, the plate 11, foot ring 12 and aperture 13 which comprise the heat spreader 5 are in this embodiment of the invention laterally square.

There are many possible alternatives to the embodiment illustrated in the figures. In an embodiment not shown in the figures, the device carrier 2 is replaced by a substrate which is known in the state of the art such as BT or leadframe. The die may be any semiconductor device or plurality of devices but the invention is particularly advantageous for power devices which generate a lot of heat. The solder balls 9 may be replaced by any suitable device contacting means, such as pins.

The heatspreader 5 may be made from any thermally conductive material such as Ag, Al or one of their alloys, a Cu-alloy. A metal/Invar type composite is also possible which also has the advantage in reducing the difference in thermal expansion properties between the die 3 and the heatspreader 5. The form of the upper plate 11 of the heatspreader 5 is not important but may be a round disc, hexagonal disc, etc., and can be as large as necessary to dissipate the heat from a given die 3. The form of the foot ring 12 can be chosen so that the contact area between the foot ring 12 and the heat producing areas of the die 3 is maximized. It is therefore clear that any lateral form of the heat spreader 5 and therefore cavity 14 is possible. The wires 4 making up the electrical connection between the die 3 and the device carrier 2 may be replaced by other connecting means. The package may or may not be encapsulated and the top surface of the heatspreader may or may not be encapsulated.

In one embodiment, the method to assemble a semiconductor package is as follows:

After the attachment of a die 3 to a device carrier 2 using die attach material 17, bond wires 4 are attached between the die pads 10 and the contact areas 7 to electrically connect the die 3 with the device carrier 2.

The heat spreader 5 is then positioned an the upper active surface of the die 3 and the cavity 14 formed by the aperture 13, foot ring 12 and upper surface of the die 3 is filled with adhesive material 15. The gap 19 between the foot ring 12 and upper active surface of the die 3 is filled with the adhesive material 15 which flows from the cavity 14. After the adhesive material is dispensed into the cavity 14, it is given an appropriate curing treatment to attach the heat spreader 5 to the die 3.

The structure of the heatspreader 5 assures that the adhesive material 15 is contained largely within the cavity 14 and does not spread onto the die pads 10 and wires 4. This enables the use of thermally conductive adhesive material which is also electrically conductive. Such adhesive material enables the more efficient dissipation of the heat generated by the active upper surface of the die 3.

The package is then encapsulated by a molding process and solder balls 9 are attached to the device contacts 8 on the bottom surface of the device carrier 2. The solder balls 9 enable the package to be mounted onto a circuit board (not illustrated) and the transfer of signals from external devices (also not illustrated).

In an alternative embodiment of the invention the encapsulation step is omitted.

The heat generated by the die 3 is dissipated by conduction into the foot ring 12, into the adhesive material 15 and into the upper plate 11 of the heatspreader 5. The heatspreader 5 provides an improved upward thermal conductive path as, firstly, there is a physical contact between the heatspreader 5 and the upper active surface of the die 3. Secondly, any gaps or imperfections in this interface are filled by the adhesive material 15. Thirdly, the adhesive material 15 contains at least in part metal particles providing the adhesive material with improved thermal conduction properties. The heat is then finally dissipated into the air by radiation from the heatspreader 5 and/or plastic cover.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor package comprising:
   a device carrier having a plurality of contact areas;
   a semiconductor die having a plurality of die pads on an active surface, the semiconductor die being mounted on the device carrier; and
   a heat spreader mounted on the active surface of the die, wherein the heat spreader includes an upper plate and a foot ring protruding from a bottom surface of the upper plate, the foot ring defining a first side having a first length and a second side having a second length unequal to the first length,
   wherein the second length is shorter than the first length and the second side of the foot ring is offset from the active surface of the die to define a gap interface.

2. The semiconductor package of claim 1, wherein the heat spreader is positioned between the die pads on the active surface such that a cavity is formed between the heat spreader and the active surface, the cavity being filled with an adhesive interconnecting the heat spreader and the active surface.

3. The semiconductor package of claim 2, comprising one or more connectors to electrically connect the die pads to the contact areas.

4. The semiconductor package of claim 2, wherein the adhesive comprises a solder.

5. The semiconductor package of claim 2, wherein the heat spreader includes an aperture located in the upper plate, the aperture extending between the cavity and the upper surface of the upper plate.

6. The semiconductor package of claim 1, wherein the upper plate of the heat spreader is laterally square.

7. The semiconductor package of claim 1, wherein the foot ring is laterally square.

8. The semiconductor package of claim 1, wherein the upper plate of the heat spreader is laterally larger than the width of the die.

9. The semiconductor package of claim 1, where the height of the foot ring is greater than the height of the connector above the upper surface of the die.

10. The semiconductor package of claim 1, where the adhesive is a thermally conductive adhesive.

11. The semiconductor package of claim 10, where the adhesive includes at least one of an epoxy glue, a sealant resin, a thermal grease or a liquid encapsulant.

12. The semiconductor package of claim 10, where the adhesive comprises an electrically conductive material.

13. A semiconductor package comprising:
   a device carrier having a plurality of contact areas;
   a semiconductor die having a plurality of die pads on an active surface, the semiconductor die being mounted on the device carrier;
   connection means to electrically connect the die pads to the contact areas; and a heat spreading means mounted on the active surface of the die, wherein the heat spreading means includes an upper plate and a foot ring which protrudes from a bottom surface of the upper plate, the foot ring positioned between the die pads on the active surface and including a portion that is offset from the active surface of the die to define a gap interface and a cavity between the heat spreading means and the active surface, the gap interface and the cavity being filled with an adhering means interconnecting the heat spreading means and the active surface.

14. The semiconductor package of claim 13, wherein the adhering means comprises an adhesive.

15. The semiconductor package of claim 13, wherein the adhering means comprises a solder.

16. The semiconductor package according to claim 13, wherein the heat spreading means includes an aperture located in the upper plate, the aperture extending between the cavity and the upper surface of the upper plate.

17. The semiconductor package of claim 13, wherein the upper plate of the heat spreading means is laterally square.

18. The semiconductor package of claim 17, wherein the foot ring is laterally square.

19. The semiconductor package of claim 13, wherein the upper plate of the heat spreading means is laterally larger than the width of the die.

20. The semiconductor package of claim 13, where the height of the foot ring is greater than the height of the connection means above the upper surface of the die.

21. The semiconductor package of claim 13, adhering means comprises an adhesive, and the adhesive is a thermally conductive adhesive.

22. The semiconductor package of claim 21, where the adhesive includes at least one of an epoxy glue, a sealant resin, a thermal grease or a liquid encapsulant.

23. The semiconductor package of claim 21, where the adhesive comprises an electrically conductive material.

24. The semiconductor package of claim 13, wherein the foot ring defines a first side having a first length and a second side having a second length shorter than the first length, the second side offset from the active surface of the die to define the gap interface.

25. A semiconductor package comprising:
 a device carrier having a plurality of contact areas;
 a semiconductor die having a plurality of die pads on an active surface, the semiconductor die being mounted on the device carrier;
 a heat spreader mounted on the active surface of the die, wherein the heat spreader includes an upper plate and a foot ring which protrudes from a bottom surface of the upper plate to partially contact the active surface of the die, wherein the heat spreader is positioned between the die pads on the active surface such that a cavity is formed between the heat spreader and the active surface, the cavity being filled with an adhesive interconnecting the heat spreader and the active surface; and
 one or more connectors to electrically connect the die pads to the contact areas,
 wherein a gap interface is formed between the foot ring and the active surface of the die, the gap interface being filled with an adhesive interconnecting the foot ring and the active surface.

26. The semiconductor package of claim 25, wherein the heat spreader includes an aperture located in the upper plate, the aperture extending between the cavity and the upper surface of the upper plate;
 wherein the upper plate of the heat spreader is laterally square;
 wherein the foot ring is laterally square; wherein the upper plate of the heat spreader is
 laterally larger than the width of the die;
 where the height of the foot ring is greater than the height of the connector above the upper surface of the die;
 where the adhesive material is a thermally conductive adhesive, and where the adhesive material includes at least one of an epoxy glue, a sealant resin, a thermal grease or a liquid encapsulant.

27. The semiconductor package of claim 25, where the adhesive material comprises an electrically conductive material.

* * * * *